United States Patent [19]

Ikeda

[11] 4,388,538
[45] Jun. 14, 1983

[54] DELAY SIGNAL GENERATING CIRCUIT
[75] Inventor: Hiroaki Ikeda, Tokyo, Japan
[73] Assignee: Nippon Electric Co., Ltd., Tokyo, Japan
[21] Appl. No.: 191,622
[22] Filed: Sep. 29, 1980
[30] Foreign Application Priority Data
  Sep. 28, 1979 [JP] Japan .................... 54-124961
[51] Int. Cl.³ ............... H03K 17/687; H03K 19/094
[52] U.S. Cl. .................................. 307/482; 307/578; 307/594; 307/605
[58] Field of Search ............... 307/262, 578, 482, 594, 307/601, 603, 605
[56] References Cited
U.S. PATENT DOCUMENTS
  3,898,479  8/1975  Proebsting .................... 307/482
  4,122,361 10/1978  Clemen et al. ............... 307/482

Primary Examiner—John Zazworsky
Attorney, Agent, or Firm—Sughrue, Mion, Zinn, Macpeak and Seas

[57] ABSTRACT

A digital circuit having a delay function which is operable with low power consumption and fabricated with a high-density integrated structure is disclosed. The circuit comprises a boot-strap circuit operable with a drain supply voltage and a source supply voltage, a first transistor of enhancement type having a drain connectable to the drain supply voltage and a source connected to an output node, a second transistor of depletion type having a drain connected to a boot node of the boot-strap circuit whose potential is operatively raised above the drain supply voltage and a source connected to the gate of the first transistor, and means for controlling the second transistor.

10 Claims, 8 Drawing Figures

DELAY SIGNAL GENERATING CIRCUIT

The present invention relates to a delay signal generating circuit, and more particularly to a boot-strap type delay signal generating circuit.

Integrated circuits employing field effect transistors, particularly of the metal-insulator-silicon type, commonly referred to as MISFETs have been used extensively for digital data processing. One of the fundamental circuits used in digital data systems is a simple inverter circuit typically comprised of a load element and a switching transistor connected in series between a drain supply voltage (referred to as $V_{DD}$) and a source supply voltage (referred to as $V_{SS}$). When the transistor is switched on by a voltage near the $V_{DD}$, a positive voltage for N-channel transistors and negative for P-channel transistors, the output node is pulled down to a voltage near the $V_{SS}$. For improving the switching speed and output level, many types of so-called boot-strap circuits have been proposed. In the boot-strap circuits, an output signal is necessarily delayed from an input signal to the circuit, and hence the boot-strap type circuit is extensively used as a delay signal generating circuit. For example, one typical such circuit is disclosed in Japanese Patent Application Disclosure No. 87,334/75 (corresponding to U.S. Pat. No. 4,061,933 issued to Proebsting et al.).

In this type of circuit, when receiving an input signal rising from the source potential power source to the drain potential power source, a delay output signal is produced with the same amplitude as that of the input signal. Those circuits are based on an idea that a potential at the gate of a transistor to drive an output signal is pulled up to a potential higher than the $V_{DD}$ potential by using an input signal, its delayed signal and a boot-strap capacitor. The circuit of the mentioned patent application is essentially comprised of a boot-strap stage series circuit and an output stage circuit. However, in this circuit, a large amount of DC current inevitably occurs at the output stage series circuit during a delay period for effecting boot-strap function. This tendency is extended in proportion to the delay period, and hence in a case of a large delay period a large amount of DC current is wanted.

Furthermore, during the delay period a switching transistor in the output stage series circuit is conducted to pull an output potential down, the switching transistor must be fabricated with a large drivability. This is unfavorable for a high density of integrated circuit structure.

It is an object of the present invention to provide a circuit operable with a small power consumption.

It is another object of the present invention to provide a digital integrated circuit fabricated with high-density.

It is still another object of the present invention to provide a delay signal generating circuit which limits a DC current to a small current even when a long delay time is needed between the input and output signals without a large transistor and has a drive ability sufficient to drive a heavy load.

A digital circuit according to the present invention comprises a first node, a first series circuit coupled between a drain supply voltage and a source supply voltage, the first series circuit including a first and a second enhancement type transistor connected in series, capacitor means coupled between a common junction of the first series circuit and the first node, means for connecting the gate of the first transistor to the first node, control means for operatively controlling the first series circuit in such a manner that a potential at the first node is raised above the drain supply voltage by boot-strap effect, an output node, a second series circuit including a third and a fourth enhancement type transistors connected between the drain supply voltage and the source supply voltage, means for connecting a common junction of the second series circuit to the output node, a depletion type transistor, means for connecting a drain of the depletion type transistor to the first node, means for connecting a source of the depletion type transistor to the gate of the third transistor, means for supplying the gate of the depletion type transistor with the substantially same signal as the signal at the common junction of the first series circuit and means for supplying the gate of the fourth transistor with the substantially same signal as a signal at the gate of the second transistor.

According to the present invention, there is provided a delay signal generating circuit in which an internal potential boosted to a potential higher than a drain power source voltage, which is delayed by a given time after an input signal, is produced by the combination of the input signal and a precharge signal through a boot-strap capacitor, and a delayed signal of the input signal is produced at the source of an enhancement type transistor by driving the enhancement type transistor with the internal potential, characterized in that a first node as a node producing the internal potential and also connected to one end of the boot-strap capacitor is coupled with the drain of a depletion type transistor, either the other terminal of the boot-strap capacitor or a second node having a potential variation similar to that at the other terminal of the boot-strap capacitor is connected to the gate of the depletion type transistor and the source of the depletion type transistor is coupled with the gate of the enhancement type transistor.

In the present invention, a first node with a potential boosted to a potential above the potential $V_{DD}$ by the boot-strap capacitor is connected to the drain of a depletion type MOS transistor with a proper threshold value. Either a second node as an opposite electrode of the boot-strap capacitor terminal connected to the node or a third node having a potential variation similar to that at the second node is connected to the gate of the depletion type MOS transistor. The source of the depletion type MOS transistor as a fourth node is connected to the gate of an enhancement type MOS transistor for output signal drive. With such a connecting arrangement, the potential rise at the fourth node is limited only during a period of a low potential at the second or third node thereby to restrain the ability of the output signal drive transistor during that period. This leads to the reduction of the DC current produced during a period that a potential difference is stored between the first and second nodes as both the ends of the boot-strap capacitor and during a period that the poor low level of the output signal is prohibited. As a result, it is possible to reduce the size of the transistor which prohibits the poor low level of the output signal. Further, if the potential at the second or third node increases and the potential of the first node is capacitively increased above the potential $V_{DD}$, the potential at the gate, as a fourth node, of the output signal drive transistor can be rapidly increased to above the potential $V_{DD}$.

The circuit according to the present invention is applicable to many kinds of delay circuits, drive circuits and timing signal generator circuits.

In the following descriptions, it is assumed that all the transistors employed are N-channel MOS transistors. P channel MOS transistors are similarly employed to the present invention. Also in the following, transistors not referred to as "depletion type" are all enhancement type transistors.

Figure 1:
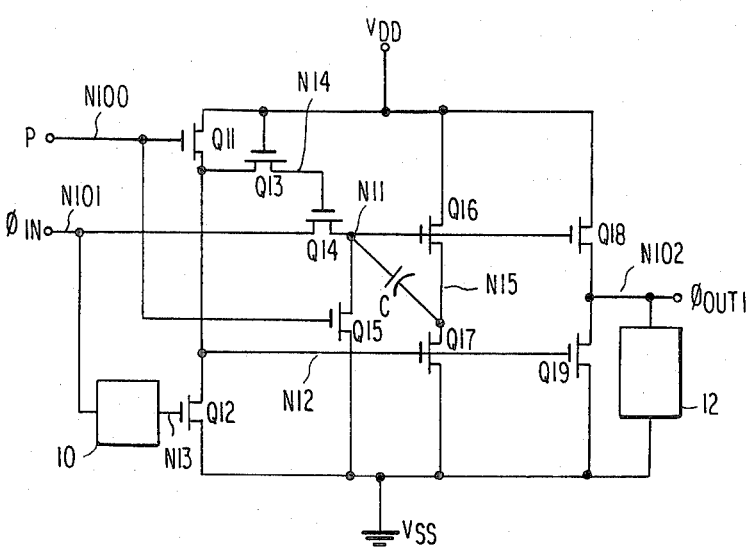
FIG. 1 is a circuit diagram of a conventional delay signal generating circuit.
Figure 2:
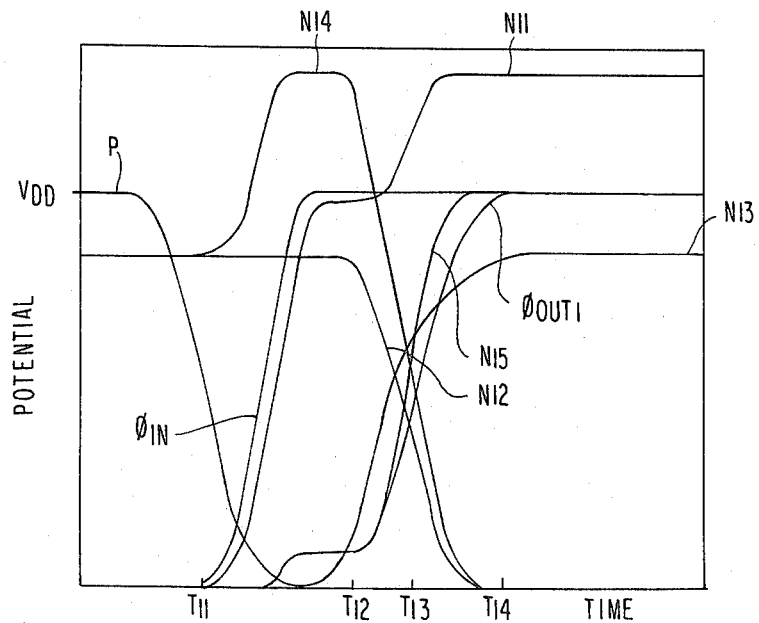
FIG. 2 is waveforms at the respective positions when the circuit shown in FIG. 1 operates.
Figure 3:
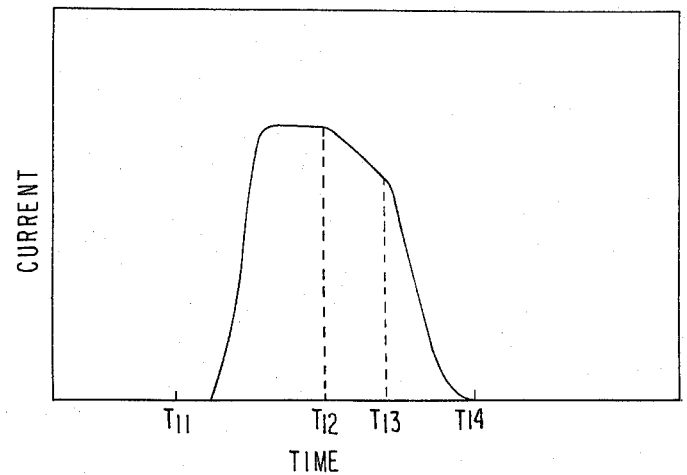
FIG. 3 is a waveform of a drain power source current when the circuit shown in FIG. 1 operates.

With reference to FIGS. 1 to 3, an example of the conventional delay signal generating circuits will be described.

In the circuit shown in FIG. 1, during a period that a precharge signal P is at a high potential and an input signal $\phi_{IN}$ is at a potential $V_{SS}$ (ground potential), a node N12 between two transistors Q11 and Q12 which are connected in series between the $V_{DD}$ and the $V_{SS}$ is precharged by the precharge signal P supplied to a node N100 common to the gate of the transistor Q11. A node N14, common to the source of a transistor Q13 whose drain and gate are connected to a node N12 and the $V_{DD}$, respectively, is also precharged through the transistor Q13.

From common junction points of two sets of transistors Q16 and Q17, and Q18 and Q19 which are connected in series between the $V_{DD}$ and $V_{SS}$, a node N15 and an output terminal N102 are derived respectively. Gates of the transistors Q17 and Q19 are connected to a common node N12. A transistor Q15 connected between the node N11 and the $V_{SS}$ sets the node N11 to the $V_{SS}$ potential in response to the precharge signal P applied to a node N100 common to the gate of the transistor Q15. The node N15 and the output terminal N102 are at the potential $V_{SS}$ because the node N12 connected to the gates of the transistors Q17 and Q19 is precharged. The drain of a transistor Q14, whose source is common to the node N11 and the gate is common to the node N14, is connected to an input terminal N101. A boot-strap capacitor C is connected between the nodes N11 and N15. The input signal $\phi_{IN}$ enters through the input terminal N101 a delay circuit 10 whose output terminal N13 is connected to the gate of the transistor Q12. A load circuit 12 is connected to the output terminal N102.

The operation of the circuit shown in FIG. 1 will be described when the potential of the precharge signal P drops to the potential $V_{SS}$ and the input signal $\phi_{IN}$ rises.

After the precharge, the transistor Q13 is turned off. Accordingly, the potential of the node N14 at a high impedance, when the input signal $\phi_{IN}$ rises, is increased from a potential precharged to a potential higher than $V_{DD}$ potential through the capacitive coupling with the input terminal N101 and the node N11.

Accordingly, at this time the transistor Q14 keeps its ON state, so that the potential at the node N11 rapidly rises up to the potential $V_{DD}$, following the input terminal $\phi_{IN}$. Upon the rise of the potential at the node N11, the transistors Q16 and Q18 are turned on. At this time, the potential at the node N12 is high. Accordingly the transistors Q17 and Q19 are also on, and therefore the node N15 and an output signal $\phi_{OUT1}$ are kept at a low potential. At this time, the boot-strap capacitor C stores a potential difference between the nodes N11 and N15 at the both ends thereof, and further a DC current flows from the $V_{DD}$ to $V_{SS}$ through the transistors Q16 and Q17, and Q18 and Q19. The DC current is used only for keeping the node N15 and the output signal $\phi_{OUT1}$ at a low potential and not for driving the output signal $\phi_{OUT1}$ directly.

Then, when the delayed potential of the input signal $\phi_{IN}$ from the delay circuit 10 appears at the node N13, the transistor Q12 is turned on and the potential at the N12 decreases from the precharged potential to the potential $V_{SS}$. At this time, since the transistor Q13 is turned on, the potential at the node N14 also decreases to the potential $V_{SS}$. Accordingly, since the transistors Q17, Q19 and Q14 are turned off and the transistors Q16 and Q18 are turned on, the potentials at the node N15 and the output signal $\phi_{OUT1}$ increase. Upon the increase of the potential at the node N15, the boot-strap capacitor C increases the potential at the node N11 made at a high impedance to a potential higher than $V_{DD}$ potential. As a result, the transistor Q18 provides at the output terminal N102 the output signal $\phi_{OUT1}$ whose potential increases to the potential $V_{DD}$.

Operating states at the respective nodes when the input signal $\phi_{IN}$ rises after the precharge, is shown in FIG. 2. In the figure, T11 is a time point when the input signal $\phi_{IN}$ rises. T12 is a time point when the transistor Q12 is turned on. T13 is a time when the transistors Q17 and Q19 are turned off. T14 is a time point when a potential of the output signal $\phi_{OUT}$ rises to the potential $V_{DD}$ and the signal output operation of the circuit is completed.

A state of the drain power source current flowing into the circuit when a sequence of those operations are performed, is shown in FIG. 3. As seen from FIG. 3, the two sets of transistors Q16 and Q17, and Q18 and Q19 are both turned on from time T11 to T13. During this period, a DC current path is formed from the $V_{DD}$ to the $V_{SS}$. The DC current at this time is the sum of the full drain power source current flowing from time T11 to T12 and most of the drain power source current from T12 to T13.

Accordingly, the drain power source current used for driving the load circuit 12 is the sum of parts of the current from T12 to T13 and the current from T13 to T14. This indicates that a great part of the drain power source current which is necessary for driving the output signal up to the potential $V_{DD}$ by the circuit shown in FIG. 1, is occupied by the DC current not driving the load circuit 12.

The tendency that the great part of the drain power source current flows in the form of the DC current is more distinguishable, when a long delay time is necessary between the input signal $\phi_{IN}$ and the output signal $\phi_{OUT1}$.

In the circuit shown in FIG. 1, when a long delay time is required between the input signal $\phi_{IN}$ and the output signal $\phi_{OUT1}$, the output signal $\phi_{OUT1}$ during the period of a high potential at the node N12 must be controlled to such a potential as not to erroneously operate the load circuit 12, even if the potential at the node N11 rises with the input signal $\phi_{IN}$. To this end, the transistor Q19 must have an ability or a size five times that of the transistor Q18, although it depends on the voltage $V_{DD}$. Further, the size of the transistor Q18 is determined depending almost on a scale of the load circuit 12. Accordingly, in the case of a heavy load of the load circuit 12, the large transistors Q18 and Q19, when the circuit is fabricated by the integrated circuit, occupy a great area on the chip. Further, in the large transistors Q18 and Q19, large current flows therethrough and most of it is the DC current not driving the output signal $\phi_{OUT1}$ i.e. waste current. This tendency becomes more distinguishable, as the load is heavier and the delay time is longer. The circuit involving those tendencies is not limited to the circuit shown in FIG. 1. Also in the conventional delay signal generating circuit in which the node with the potential pulled up to a potential higher than the $V_{DD}$ by the boot-strap capacitor is directly connected to the gate of the output drive transistor, the tendencies are distinguishably observed when a long delay time is required between the input and output signals and a heavy load is driven.

Figure 4:
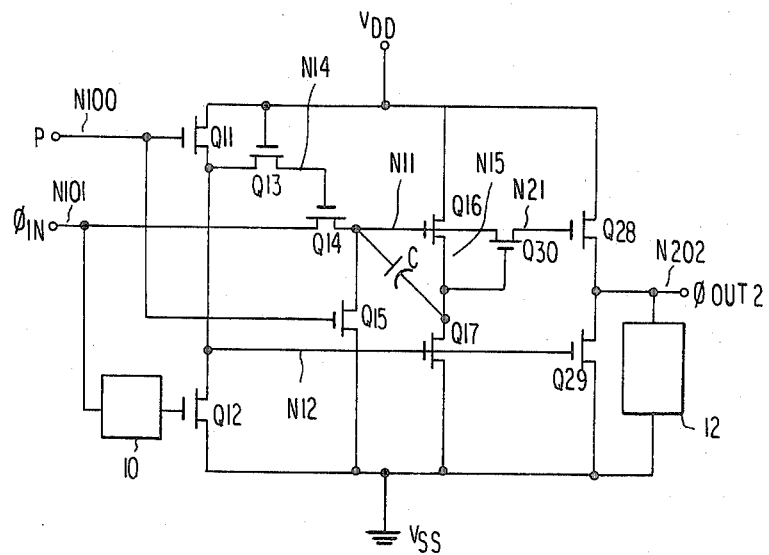
FIG. 4 is a circuit diagram of an embodiment of the delay signal generating circuit according to the present invention.

An embodiment of the delay signal generating circuit according to the present invention is shown in FIG. 4.

The circuit includes an arrangement which is exactly the same as the interconnections of the conventional circuit shown in FIG. 1 containing the input signal $\phi_{IN}$, the precharge signal P, the delay circuit 10, the boot-strap capacitor C, the transistors Q11 to Q17, the nodes N11 to N15 and two input terminals N100 and N101, and those parts and portions have exactly the same function as those of the conventional circuit.

In addition to this arrangement, an output terminal N202 is derived from a common junction point of two transistors Q28 and Q29 connected in series between the $V_{DD}$ and $V_{SS}$, and connected to the load circuit 12. Further, a depletion type MOS transistor Q30 with a threshold voltage of about $-(V_{DD}-V_{SS})/2$ having a drain connected to the nodes N11, a gate connected to the node N15 and a source connected to the node N21 common to the gate of the transistor Q28, is provided.

The enhancement type MOS transistor may be any transistor which is operable in an enhancement mode when it is used. Further, the transistor may be replaced by any transistor which operates in a depletion mode when the substrate potential is 0 V or no power source is turned on.

The explanation to follow is for the operation of the delay signal generating circuit according to the invention shown in FIG. 4 when the precharge signal P falls down to the potential $V_{SS}$ and the input signal $\phi_{IN}$ rises.

With the rise of the input signal $\phi_{IN}$, the node N11 rises to the potential $V_{DD}$ to turn on the transistor Q16. At this time, the node N12 has been precharged by the transistor Q11 to have a high potential. Accordingly, the transistor Q17 is conducting, so that the nodes N15 is kept at low potential. Accordingly, even if the potential at the node N11 rises up to the potential $V_{DD}$, the transistor Q30 is turned off when the potential difference between the nodes N15 and N21 approximates to $(V_{DD}-V_{SS})/2$. The result is that the potential at the node N21 is kept lower than $V_{DD}$.

At this time, the potential difference between the nodes N11 and N15 is stored into the boot-strap capacitor C. Afterward, upon receipt of the output signal of the delay circuit 10, the transistor Q12 is turned on. Then, as the potential at the node N12 falls to the potential $V_{SS}$, the transistors Q17 and Q29 are turned off and the potential at the node N15 rises by the transistor Q16. The potential of the node N11 is capacitively boosted to the potential $V_{DD}$ by the boot-strap capacitor. At this time, the transistor Q30 is turned on with the potential rise at the node N15 to pull up the potential at the node N21 to a potential above the potential $V_{DD}$ in accordance with the potential at the node N11. As a result, the transistor Q28 drives the output signal $\phi_{OUT2}$ up to the potential $V_{DD}$.

Figure 5:
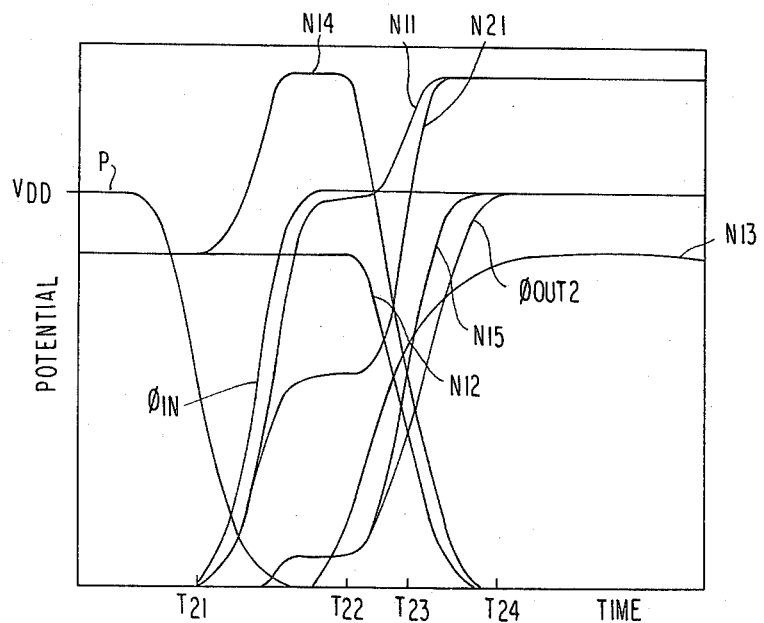
FIG. 5 is waveforms at the respective portions when the circuit shown in FIG. 4 operates.

Operation states at the respective nodes when the input signal $\phi_{IN}$ rises after the precharge in the circuit shown in FIG. 4, is illustrated in FIG. 5.

In FIG. 5, T21 designates a time point that the input signal $\phi_{IN}$ rises. T22 is a time point that the transistor Q12 is turned on. T23 is a time point that the transistors Q17 and Q29 are turned off. T24 is a time point that the output signal $\phi_{OUT2}$ rises to the potential $V_{DD}$ and the signal outputting operation of this circuit is completed.

Figure 6:
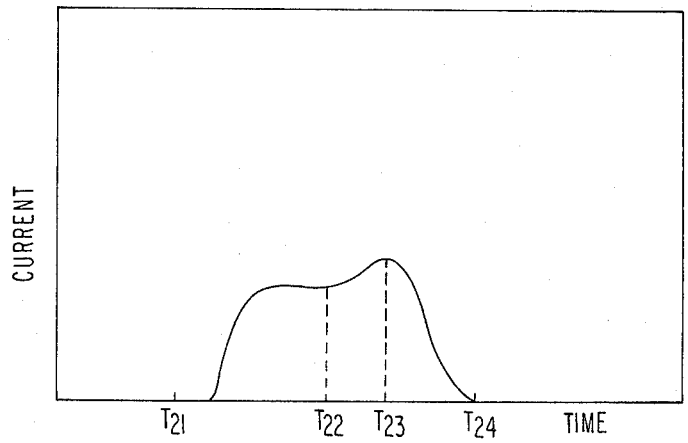
FIG. 6 is a waveform of a drain current when the circuit of FIG. 4 operates.

A flow state of the drain power source current in the circuit shown in FIG. 4 when a sequence of those operations are performed, is shown in FIG. 6.

During the period from time T21 to T23, the two sets of the transistors Q16 and Q17, and transistors Q28 and Q29 are both turned on and a DC current path is formed from the $V_{DD}$ to $V_{SS}$. However, for the period, the potential at the node N21 is about $(V_{DD}-V_{SS})/2$, which is lower than the $V_{DD}$, through the action of the depletion transistor Q30. For this reason, the ability of the transistor Q28 is considerably degraded during this period. As a consequence, the DC current flowing through the series circuit of the transistors Q28 and Q29 is much smaller than the DC current.

Note here that only during this period, the transistor Q29 is used to suppress poor low level of the output signal. Therefore, the transistor Q29 has no longer the ability as essentially required. Accordingly, the ability and the size of the transistor Q29 may be reduced according to the degradation of the ability of the transistor Q28.

The potential at the node N21 may rapidly be increased above the potential $V_{DD}$ with the potential rise at the node N15 merely by designing the transistor Q30 such that the transistor Q30 is half-sized compared to the transistor Q28 while having an ability enough to drive the capacitive load at the node N21. Therefore, the delay signal generating circuit of the invention has the load drive ability comparable with that of the conventional circuit. To verify these features, the inventor designed the delay signal generating circuit shown in FIG. 4 under a condition that $V_{DD}=5$ V, $V_{SS}=0$ V, the threshold voltage of the transistor Q30 is $-3$ V and the load circuit 12 is a capacitor of 10 pF. Further, the operation of the signal generating circuit thus designed was analyzed by using an electronic computer. The result of the analysis was very satisfactory. For example, the poor low level preventive effect comparable with the conventional one was attained by the transistor Q29 of which the size is smaller than the half of the conventional one. Further, the DC current was reduced ½ to ⅓ that of the conventional circuit.

Therefore, the delay signal generating circuit of the present invention has great improvements in the reduction of power consumption and the area occupied by the elements used and the reliability resulting from the reduced DC current. In this respect, it is very useful as a constituent element of a high density semiconductor integrated circuit.

Further, the useful features of the delay signal generating circuit according to the present invention are very effective particularly for a case requiring a long delay time between the input and output signals, for a case for driving a large load or for both the cases.

Figure 7:
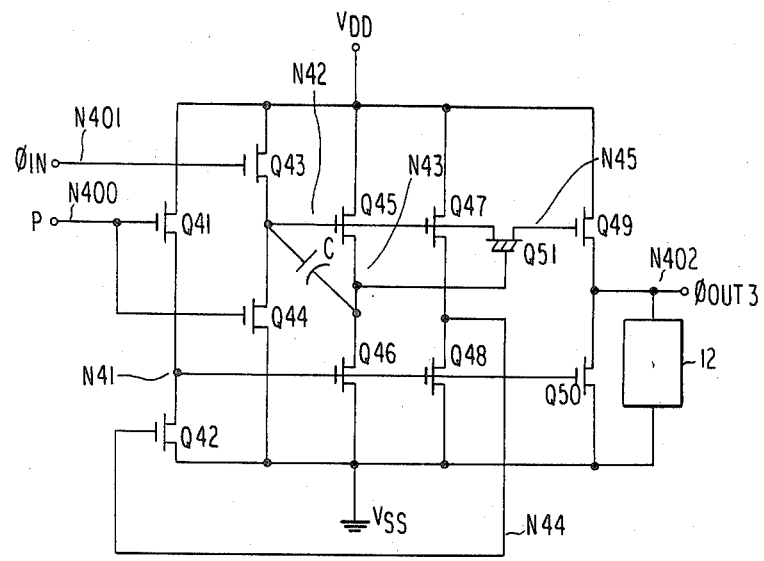
FIGS. 7 and 8 are circuit diagrams of other embodiments of the signal generating circuit according to the invention.

The delay signal generating circuit of the present invention is not limited to the embodiment shown in FIG. 4. To be more specific, the arrangement of the delay circuit 10 and the means for introducing the input signal to the node at which the potential is boosted to the potential higher than the $V_{DD}$ by the boot-strap capacitor, are not necessarily the factors essential to the useful features of the present invention. To illustrate this, another embodiment of the delay signal generating circuit of the present invention is shown in FIG. 7.

In the figure, Q41 to Q50 are enhancement type MOS transistors; Q51 is a depletion type MOS transistor; N41 to N45 nodes; N400 to N402 input and output terminals; $\phi_{OUT3}$ an output signal.

Unlike the embodiment shown in FIG. 4, in the delay signal generating circuit of the present embodiment, the source follower of the input signal $\phi_{IN}$ by the transistor Q43 is transferred to the node N42 whose potential is boosted to the potential above the $V_{DD}$.

The delay potential based on the input signal for turning on the transistor Q42, is the fed-back potential of the node N44 which is one of the output signals of the circuit. That is to say, the transistor Q42 is turned on in a manner that the ability ratio between the transistors Q47 and Q48 is set to a proper value and the potential of the node N44 is raised with the potential rise at the node N42 when the input signal $\phi_{IN}$ rises. Also in the signal generating circuit shown in FIG. 7, there is never damaged the useful feature that the DC current is reduced and the size of the transistor Q50 preventing the poor low level of the output signal $\phi_{OUT3}$ may be reduced. In the delay signal generating circuit of the present invention, there is no need for the connection of the gate of the depletion type of the MOS transistor to the low potential side electrode of the boot-strap capacitor. So long as it is connected to the node taking a potential similar to that at the low potential side electrode, the same effect is attainable.

Figure 8:
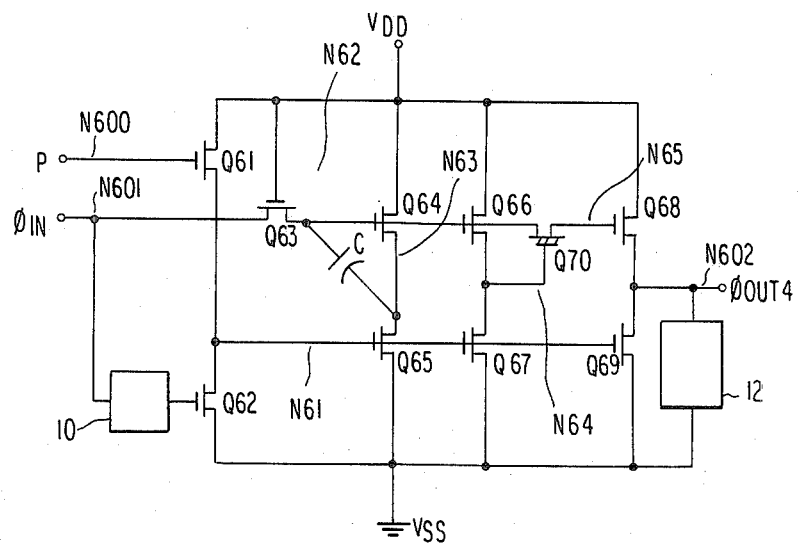

To explain this, yet another embodiment of the delay signal generating circuit according to the present invention is shown in FIG. 8.

In the figure, Q61 to Q69 are enhancement type MOS transistors; Q70 a depletion type MOS transistor; N61 to N65 nodes; N600 to N602 input and output terminals; $\phi_{OUT4}$ an output signal.

In the delay signal generating circuit of the present embodiment, unlike the embodiment shown in FIG. 4, the gate of the depletion type MOS transistor Q70 is connected to the node N64 formed by a series circuit containing the transistors Q66 and Q67, not the node N63 as the electrode of the boot-strap capacitor C. Also in this case, the useful feature of the present invention is attainable if the ability ratio between the transistors Q66 and Q67 is selected so that a potential variation at the node N63 is similar to that at the node N64.

In FIG. 8, the means for introducing the input signal $\phi_{IN}$ to the node N62 is formed by the transistor Q63 connected to the $V_{DD}$. This alternation never damages the usefulness of the circuit of the present invention.

I claim:

1. A digital circuit comprising a first node, a first series circuit including a first and a second enhancement type transistors connectable between a drain supply voltage and a source supply voltage, capacitor means coupled between said first node and a common junction point of said first series circuit, first means for connecting a gate of said first transistor to said first node, control means for operatively controlling said first series circuit in such a manner that a potential at said first node is raised above said drain supply voltage in absolute value by boot-strap effect, an output node, a second series circuit including a third and a fourth enhancement type transistors connectable between a drain supply voltage and a source supply voltage, a second means for connecting a common junction point of said second series circuit to said output node, a depletion type transistor, third means for connecting a drain of said depletion type transistor to said first node, fourth means for connecting a source of said depletion type transistor to a gate of said third transistor, and fifth means for supplying a gate of said depletion type transistor with a signal having the substantially same level as a signal at said common junction point of said first series circuit.

2. The circuit according to claim 1, further comprising sixth means for supplying a gate of said fourth transistor with a signal having the substantially same level as that at a gate of said second transistor.

3. The circuit according to claim 2, in which said control means includes means for supplying said first node with a first signal and means for supplying the gate of said second transistor with a second signal having a delayed opposite phase with respect to said first signal.

4. In a digital circuit comprising a boot-strap circuit operable with a drain supply voltage and a source supply voltage, said boot-strap circuit including a boot node whose potential is operatively raised above said drain supply voltage in absolute value and capacitor means having a first terminal connected to said boot node and a second terminal; an output node; and a first transistor of enhancement type responsive to the potential at said boot node for operatively supplying said output node with said drain supply voltage, the improvement comprising a second transistor of depletion type, means for connecting a drain of said second transistor to said boot node, means for connecting a source of said second transistor to a gate of said first transistor and means for supplying a gate of said second transistor with a signal having the substantially same level as a signal at said second terminal of said capacitor means.

5. The circuit according to claim 4, further comprising a third transistor of enhancement type having a drain connected to said output node and a source connectable to said source supply voltage.

6. A digital circuit comprising a first node, a first and a second transistor of enhancement type, a drain of said first transistor being connectable to a drain supply voltage, a source of said first transistor and a drain of said second transistor being electrically common, a source of said second transistor being connectable to a source supply voltage, a gate of said first transistor being capacitively coupled to the source of said first transistor by a capacitance, control means for sequentially causing in response to each of a sequence signals, the gate of said first transistor to transition from a voltage near the source voltage toward a voltage near the drain voltage and to turn said first transistor on thereby causing the gate of said second transistor to transition from a voltage near the drain supply voltage to a voltage near the source supply voltage to turn the second transistor off thus causing the voltage at the gate of said first transistor to exceed said drain supply voltage as a result of the capacitive coupling from the source of said first transistor to the gate of said first transistor, an output node, a third and a fourth transistor of enhancement type, a drain of said third transistor being connectable to said drain supply voltage, a source of said third transistor and a drain of said fourth transistor being electrically common to said output node, a source of said fourth transistor being connectable to said source supply, means for connecting a gate of said fourth transistor to the gate of said second transistor, and transferring means for transferring a potential at the gate of said first transistor to the gate of said third transistor when a potential difference across said capacitor is smaller than a predetermined value.

7. The circuit according to claim 6, in which said transferring means includes a fifth transistor of depletion type, means for connecting a drain of said fifth transistor to the gate of said first transistor, means for connecting a source of said fifth transistor to the gate of said third transistor, and means for supplying a gate of said fifth transistor with a signal having the substantially same potential as that at the drain of said second transistor.

8. A circuit comprising a bootstrap circuit operable with a first supply voltage and a second supply voltage, said bootstrap circuit including a boost node whose potential is operatively raised above said first supply voltage in absolute value and capacitor means having a first terminal adapted to be connected to said boost node and a second terminal; an output node; a first transistor responsive to the potential at said boost node for operatively supplying said output node with said first supply voltage; a second transistor adapted to be conducting when a potential difference across said capacitor means is smaller than a predetermined value; means for connecting one of a source and a drain of said second transistor to said boost node; means for connecting the other of a source and a drain of said second transistor to a gate of said first transistor; and means for supplying a gate of said second transistor with a signal having the same level as a signal at said second terminal of said capacitor means.

9. The circuit according to claim 8, further comprising a third transistor connected in series with respect to said first transistor.

10. The circuit according to claim 8, in which said second transistor is of a depletion type while said first transistor is of an enhancement type.

* * * * *